(12) United States Patent
Shen

(10) Patent No.: US 6,310,822 B1
(45) Date of Patent: Oct. 30, 2001

(54) DELAY LOCKING HIGH SPEED CLOCK SYNCHRONIZATION METHOD AND CIRCUIT

(75) Inventor: Chiun-Chi Shen, Chutung (TW)

(73) Assignee: Etron Technology, Inc., Hsin-chu (TW)

( * ) Notice: Subject to any disclaimer, the term of this patent is extended or adjusted under 35 U.S.C. 154(b) by 0 days.

(21) Appl. No.: 09/498,739

(22) Filed: Feb. 7, 2000

(51) Int. Cl.[7] ............................................. G11C 8/00
(52) U.S. Cl. .................... 365/233; 365/189.05; 327/294; 327/299
(58) Field of Search ............................. 365/233, 230.08, 365/189.05, 194; 327/291, 293, 294, 299, 141

(56) References Cited

U.S. PATENT DOCUMENTS

| | | | |
|---|---|---|---|
| 5,396,111 | * 3/1995 | Frangioso et al. | 327/144 |
| 5,410,263 | 4/1995 | Waizman | 327/141 |
| 5,742,194 | 4/1998 | Saeki | 327/298 |
| 5,923,613 | 7/1999 | Tien et al. | 365/233 |
| 5,946,268 | * 8/1999 | Iwamoto et al. | 365/233 |

OTHER PUBLICATIONS

Saeki et al., "A 2.5–ns Clock Access, 250–MHz, 246–Mb SDRAM with Synchronous Mirror Delay," IEEE Journal of Solid State Circuits, vol. 31, No. 11, Nov. 1996, pp. 1656–1664.

Yamada Et Al., "Capacitance Coupled Bus with Negative Delay Circuit for High Speed and Low Power (10GB/s <500mW) Synchronous DRAMs," Digest of Papers for IEEE Symp. on VLSI Circuit, 1996, pp. 112–113.

* cited by examiner

Primary Examiner—Richard Elms
Assistant Examiner—Hien Nguyen
(74) Attorney, Agent, or Firm—George O. Saile; Stephen B. Ackerman; Billy Knowles

(57) ABSTRACT

A clock synchronizer circuit provides an internal clock signal for an integrated circuit that is synchronized to an external system clock signal, such that the internal clock integrated is aligned with and has minimal skew from the external system clock signal. The clock synchronizer circuit allows synchronizing of internal clocks of an integrated circuit with the external system clock having a period $\tau_{ck}$ less than the cumulative delay of internal receiving and distribution circuits of the integrated circuit.

46 Claims, 7 Drawing Sheets

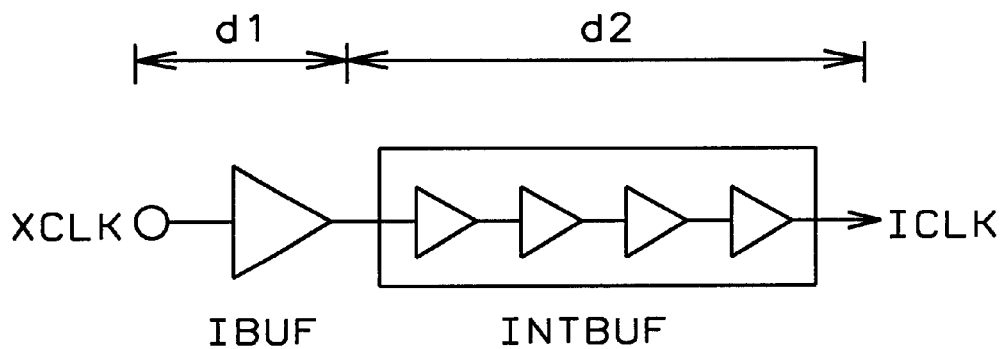
*FIG. 1a — Prior Art*
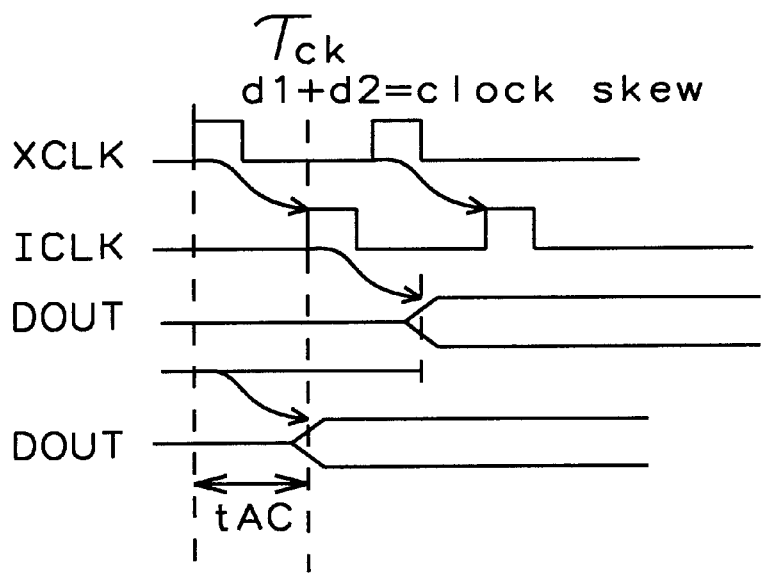
*FIG. 1b — Prior Art*

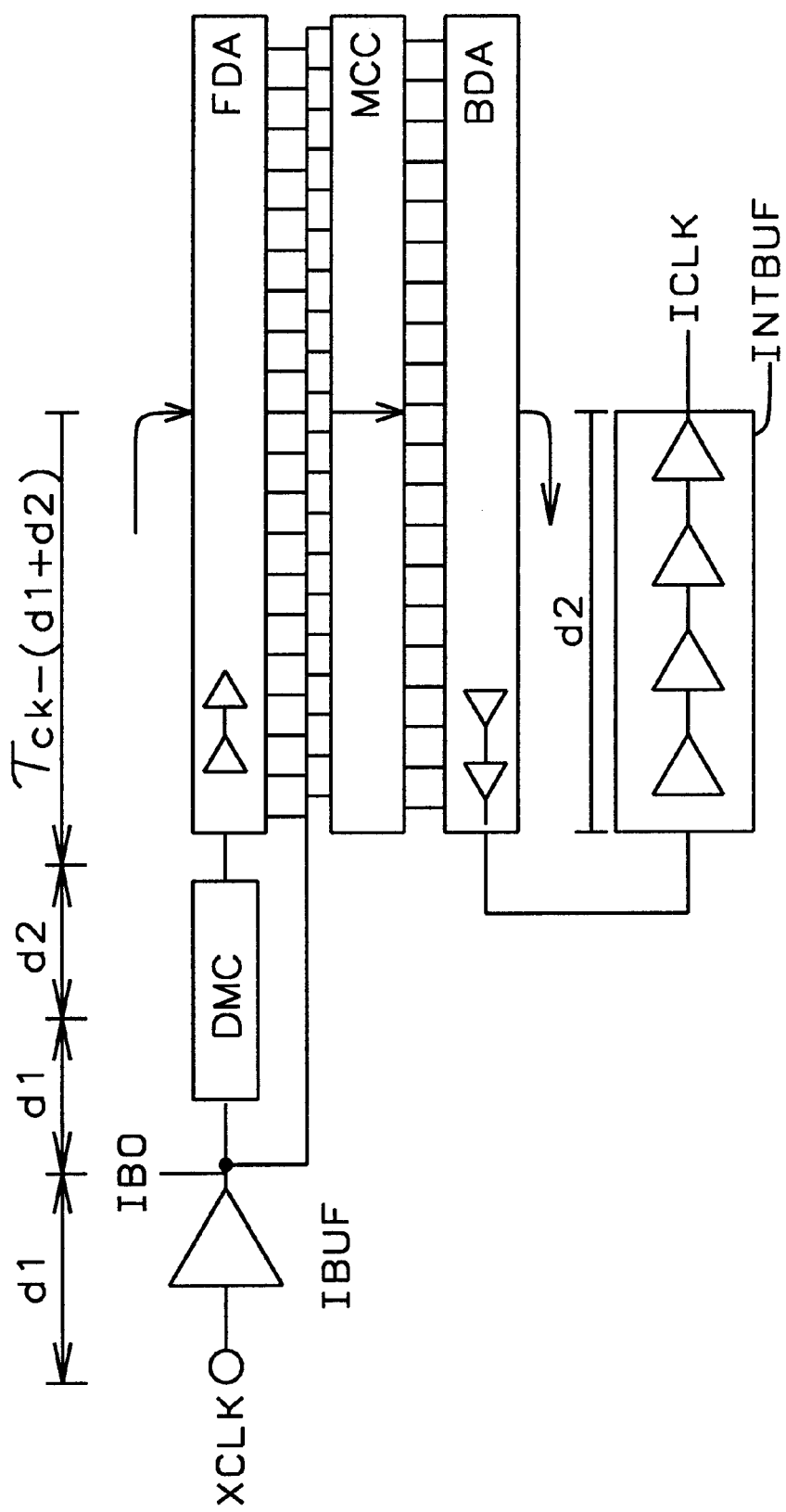
FIG. 2a – Prior Art

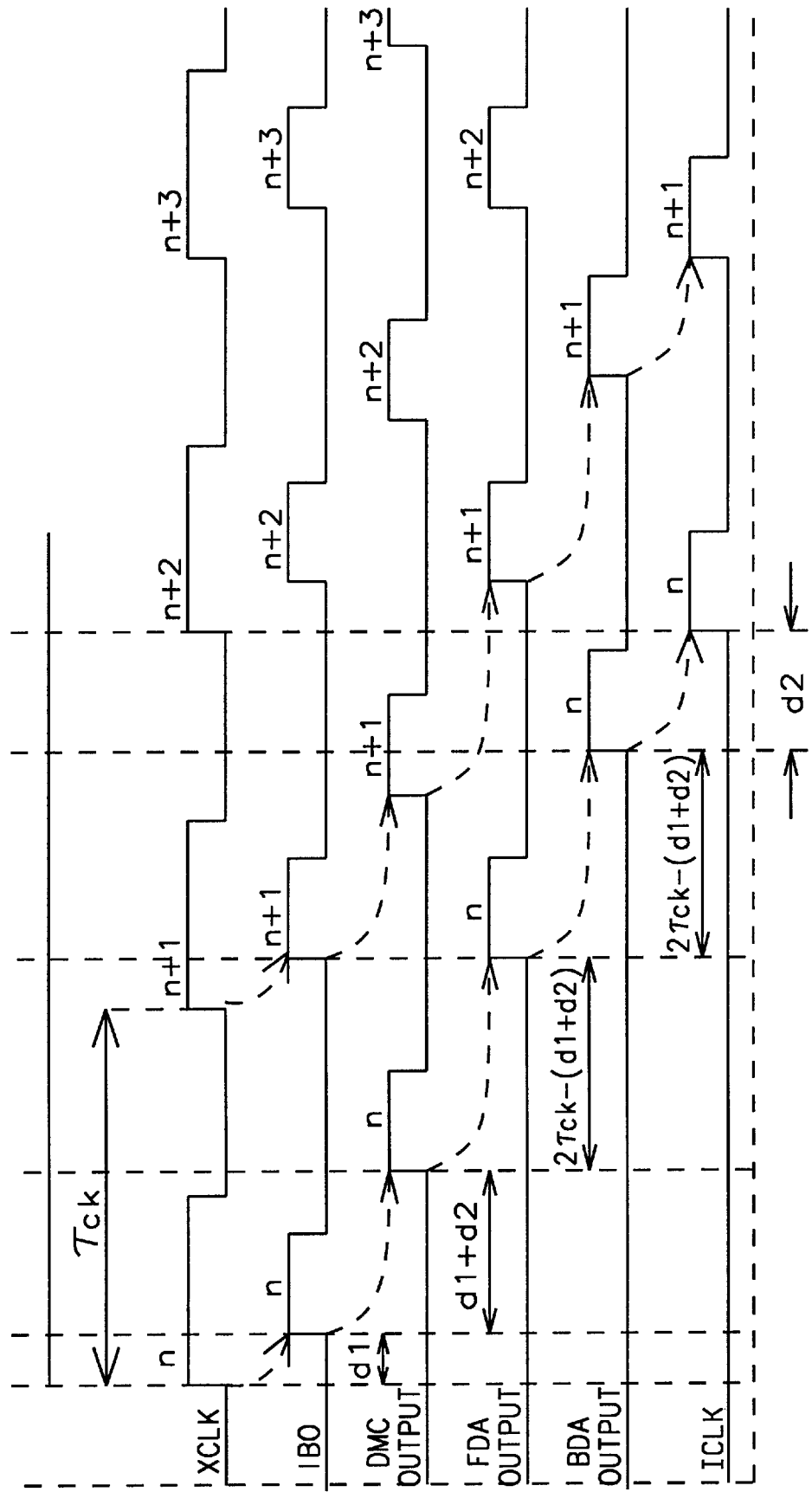
FIG. 2b – Prior Art

DELAY LOCKING HIGH SPEED CLOCK SYNCHRONIZATION METHOD AND CIRCUIT

BACKGROUND OF THE INVENTION

1. Field of the Invention

This invention relates to circuitry and methods for the synchronization and distribution of clock timing signals within integrated circuits and more particularly to clock timing signal distribution circuitry within integrated circuits such as synchronous dynamic random access memories (SDRAM) that provide an internal clocking signal that has a period that is less than the skewing from the system clocking signals caused by the cumulative delay of the internal clock receiving and distribution circuitry.

2. Description of Related Art

As is well known in the art, an SDRAM has multiple cell arrays within multiple memory banks to retain digital data. The system Address Bus $A_0, A_1, \ldots, A_n$ is connected to the Address Buffer to receive the address of the location of the retained digital data within the multiple cell arrays of the multiple memory banks. The Address Buffer transfers the requested address to the appropriate cell array within a selected memory bank, where the row and column address decoders select the appropriate location of the digital data.

The chip select $\overline{CS}$, the row address strobe $\overline{RAS}$, column address strobe $\overline{CAS}$, and the write enable $\overline{WE}$ signals form a command bus and are received by the command decoder. These signals are decoded and transferred to the control signal generator. The control signal generator generates and transfers a set of control signals that determine the operation modes of the selected cell array in the one memory bank. These modes are variations and combinations of fetching or reading from, storing or writing to, or refreshing of the digital data within the cell arrays of the memory banks.

The data control circuitry receives data from the data input/output buffers which in turn are connected to a system data bus to receive and transmit the digital data $DQ_0, \ldots, Dq_x$ to and from the cell arrays within the memory banks.

The external system clock XCLK is transferred to the clock buffer. The clock buffer then transfers the clock to the other operating units of the SDRAM. The clock that controls the timings of the data control circuitry must be such that the digital data $DQ_0, \ldots, Dq_x$ is appropriately aligned with the external system lock XCLK.

During periods of inactivity for an SDRAM, it is desirable that the SDRAM be deactivated. This is controlled by a clock enable signal XCKE.

The structure and timing of the clock distribution within the SDRAM is described in "A 2.5 ns Clock Access 250 Mhz, 256 Mb SDRAM with Synchronous Mirror Delay" by T. Saeki et al, IEEE Journal of Solid State Circuits, Vol. 31 No. 11 November 1996, pp. 1656–1664, and shown in FIGS. 1a and 1b. The external system clock XCLK is received by the input buffer IBUF. The input buffer IBUF has a delay time from the input of the external system clock XCLK to the output of the input buffer IBUF that is designated $d_1$. The output of the input buffer IBUF is the input to multiple internal buffers INTBUF. The internal buffers INTBUF then transfer the internal clock ICLK to the functional units within the SDRAM. The delay time for the internal buffer INTBUF is designated $d_2$.

The command signals chip select $\overline{CS}$, the row address strobe $\overline{RAS}$, column address strobe $\overline{CAS}$, and the write enable $\overline{WE}$, as well as the address bus $A_0, A_1, \ldots, A_n$ are gated into the SDRAM during the rise of the internal clock ICLK from a first logic level (0) to a second logic level (1). The internal clock ICLK is the timing signal that is used to synchronize the transfer of the digital data from the cell array in the memory banks to the data input/output buffers and to the data bus $DQ_0, \ldots, Dq_x$. The internal clock ICLK is delayed or skewed by the delay $d_1$ of the input buffer IBUF plus the internal buffer INTBUF. Since the timing of the functions of the SDRAM are determined by the internal clock ICLK, the access time $T_{ac}$ of the fetching or reading of the digital data can be no smaller than the clock skew $d_1+d_2$ plus the period of the internal clock ICLK. This forces the minimum time that data can be cycled from the SDRAM to be two external system clock XCLK periods. As computer system clocks are approaching transfer rates of 100 Mhz, it is desirable that the access time $T_{ac}$ of an SDRAM to be brought to one cycle of the external system clock XCLK. This means that the clock skew $d_1+d_2$ must be eliminated from the clock distribution system.

Phase Locked Loops (PLL) and Delay Locked Loops (DLL) are well known in the art for synchronizing two timing signals. In both cases, the time to achieve synchronization or lock may be on the order of 50 cycles or more. With such long lock times in SDRAM applications, the internal clocking signals ICLK can not be deactivated during the periods that the SDRAM is inactive. This increases the power dissipation of the SDRAM to undesirable levels.

The Clock Synchronization Delay (CSD) circuits are a class of synchronizing circuits that eliminates the clock skew $d_1+d_2$ within two clock cycles. Two types of CSD's known in the art are the latched type CSD and the non-latched synchronous mirror delay SMD.

FIGS. 2a and 2b show a schematic diagram and a timing diagram for the general structure of a CSD circuit. The external system clock XCLK is received by the input buffer IBUF. The output IBO of the input buffer IBUF is delayed by the delay $d_1$. The output IBO of the input buffer IBUF is the input to the delay monitor circuit DMC. The delay monitor circuit DMC provides an output that is a delayed input signal IBO by a fixed amount that is usually the sum of the delay $d_1$ of the input buffer IBUF and the delay $d_2$ of the internal buffer INTBUF.

The output of the delay monitor circuit DMC is the input of the forward delay array FDA. The forward delay array FDA comprises a number of delay elements that each delay the input of the forward delay array FDA by an increment of time $\tau_{df}$. The output of each delay element of the forward delay array FDA is the input for each subsequent delay element and is also one of the multiple outputs of the forward delay array FDA.

The multiple outputs of the forward delay array FDA are inputs to the mirror control circuit MCC. The output IBO of the input buffer circuit IBUF is also provided to multiple inputs of the mirror control circuit MCC. The output IBO of the input buffer circuit IBUF is compared with each output of the forward delay array FDA. When one of the outputs of the forward delay array FDA is aligned with the n+1 pulse of the output IBO of the input buffer IBUF, the mirror control circuit transfers that one output to the backward delay array BDA. The mirror control circuit MCC has multiple outputs to transfer any one of the inputs of the mirror control circuit MCC from the forward delay array FDA to the backward delay array BDA. The backward delay array BDA is comprised of multiple delay elements. Each delay element has a delay time $\tau_{df}$ equal to the delay time of the forward delay array FDA.

The delayed clock pulse is delayed by a factor of:

$$\tau_{FDA} = \tau_{ck} - (d_1 + d_2)$$

where $\tau_{ck}$ is the time of the period of the external clock.

$\tau_{FDA}$ is the time of the period of the external clock less the skew $d_1 + d_2$.

The delayed clock pulse is further delayed by the factor $\tau_{FDA}$ in the backward delay array BDA. Thus, the nth pulse output of the backward delay array BDA is delayed by a factor of $$2d_1 + d_2 + 2(\tau_{ck} - d_1 + d_2)$$

This makes the nth pulse of the backward delay array BDA misaligned with the n+2 pulse of the external system clock XCLK by a factor of the delay $d_2$ of the internal buffer INTBUF.

The output of the backward delay array BDA is the input of the internal buffer INTBUF. The nth internal clock ICLK is now aligned with the system clock XCLK.

If the system clock XCLK is disabled by a clock enable CLKE and then re-enabled, it requires only two system clock cycles for the internal clock ICLK to align with the system clock XCLK. Thus, any data can be accessed within a single period $\tau_{ck}$ of the system clock XCLK.

The mirror control circuit MCC is of two types. The first type as described in "Capacitive Coupled Bus with Negative Delay Circuit for High Speed and Low Power (10 GB/s<500 mw) Synchronous DRAM" by T. Yamada et al, Digest of Papers for IEEE Symposium on VLSI Circuits, 1996, pp. 112–113, is a latch that fixes the delay segment of the forward delay element FDA selected to be transferred to the backward delay array BDA. Once the latch is set, it is only reset during the inactivity time of the SDRAM. Upon reactivation of the SDRAM, the decision of the length of the delay necessary is recreated.

The second type of mirror control circuit MCC is the synchronous mirror delay. The mirror control circuit MCC is a pass gate that is activated when the output of the forward delay circuit FDA is aligned with the n+1 pulse of the output IBO of the input buffer circuit IBUF. The synchronous mirror delay chooses on each cycle of the system clock XCLK, which of the delay elements is satisfactory to align with the output IBO of the input buffer circuit IBUF.

As the system timing requirements of modern computers has increased, the frequency of the system clock XCLK has increased to a level such that period $\tau_{ck}$ of the system clock XCLK may be greater than the clock skew $d_1 + d_2$. The internal clock can then no longer be guaranteed to synchronized with the system clock XCLK.

U.S. Pat. No. 5,742,194 (Saeki) describes an internal clock generator for a SDRAM. The internal clock generator for the SDRAM provides a phase-advanced internal clock that is stably controlled with an asynchronous clock enabling signal. The asynchronous clock enabling signal provides the control without being detrimental to operation thus providing high-speed operation.

U.S. Pat. No. 5,410,263 (Waizman) teaches an integrated circuit for synthesizing a 50% duty cycle internal clock that is synchronized with zero pulse difference with respect to an external reference clock having a frequency that is equal to, or is a sub-multiple of the synthesized internal Clock. The duty cycle of the synthesized waveform is fixed and invariant with respect to the reference Clock duty cycle. Synchronization of the two clocks is achieved by a delay-line using a voltage controlled delay line with a nominal half period delay of the synthesized clock. The 50% duty cycle is achieved by a second control loop that has as its input both the reference and the inverted synthesized clock. This second loop drives the voltage controlled delay line with the synthesized internal clock signal. The integrated circuit clock synthesizer is intended to operate as an Integral part of a microprocessor or a peripheral unit operating in a system having a common external reference clock.

U.S. Pat. No. 5,923,613 (Tien et. al.) describes a multiple phase latched type synchronized clock circuit. The multiple phase latched type synchronized clock circuit creates a multiple phases of an internal clock signal in an integrated circuit that is synchronized with an external system clock signal is disclosed. A latched type clock synchronizer circuit has an input buffer circuit to receive the external input clock to create a first timing clock. The input buffer is connected to a delay monitor circuit to delay the first timing clock by a first delay factor to create a second timing clock. A delay measurement latch array is connected to the input buffer circuit and the delay monitor circuit to create a latched measurement signal, which indicates a period of time between a second pulse of the first timing clock and a first pulse of the second timing clock. A multiple delay array is connected to the input buffer to receive the first timing clock and creates multiple pluralities of incrementally delayed timing clocks. The multiple pluralities of incrementally delay timing clocks and the latched measurement signal are the inputs to a plurality of phase generators that create a plurality of third timing clocks. Each of a plurality of internal buffers is connected to each of the phase generators to receive one of the third timing clocks. The third timing clock is shaped to create one of the multiple phases of the internal clocks which are then buffered, amplified and transmitted to the integrated circuit.

SUMMARY OF THE INVENTION

An object of this invention is to provide an internal clock circuit in an integrated circuit that creates an internal clock signal that is synchronized with an external system clock signal.

Another object of this invention is to provide an internal clock circuit in an integrated circuit that creates an internal clock signal, where the period of an external system clock signal is less than the clock skew of the internal clock circuits.

To accomplish at least one of these objects, as well as other objects, a clock synchronizer circuit provides an internal clock signal for an integrated circuit that is synchronized to an external system clock signal, such that the internal clock integrated is aligned with and has minimal skew from the external system clock signal. The clock synchronizer circuit has a plurality of serially connected delaying circuits to receive the external system clock signal and delay the external system clock signal by an incremental period of delay. The incremental period of delay is equal to the period of the external system clock signal. The clock synchronizer circuit further has a plurality of frequency divider circuits. The first frequency divider circuit of the plurality of frequency divider circuits is connected to receive the external system clock signal and to divide a frequency of the external system clock signal by a dividing factor and each remaining frequency divider circuits is connected to an output of one of the serially connected delaying circuits to divide a delayed external system clock signal by the dividing factor providing a plurality of divided external system clock signals. The clock synchronizer circuit also contains a plurality of clock synchronization delay circuits. Each clock synchronization delay circuit is connected to one of the plurality of frequency divider circuits to synchronize each divided external system clock signal to the external system clock signal. A logical combining circuit is connected to each of the plurality of clock synchronization circuits to combine the synchronized, divided external system clock signal to form the internal clock signal.

The number of serially connected delaying circuits is one less than the dividing factor, while the number of frequency divider circuit is equal to the dividing factor.

Each clock synchronization delay circuit is a synchronous mirror delay circuit. The synchronous mirror delay circuit has a buffer circuit connected to one of the frequency divider circuit to buffer, amplify and delay one of the delayed and divided external timing signals to create a first timing signal. A fixed delay circuit is connected to the buffer circuit to delay the first timing signal by a circuit delay factor that is a sum of a first delay factor and a second delay factor. The first delay factor is a delay time of the frequency divider circuit and the buffer circuit. A forward delay circuit measures a difference time period. The difference time period is the circuit delay factor subtracted from the period of the delayed and divided external timing signal. A mirror delay circuit is connected to the forward delay circuit and the buffer circuit to delay the first timing signal by the difference time period to create a second timing signal. An internal buffer circuit is connected to the mirror delay circuit to amplify, delay the second timing signal to create the synchronized, divided external system clock signal whereby a delay time of the internal buffer circuit is the second delay factor.

In a second embodiment of a clock synchronizer circuit that provides an internal clock signal for an integrated circuit that is synchronized to an external system clock signal, such that the internal clock signal integrated is aligned with and has minimal skew from the external system clock signal has a single frequency divider circuit that receives the external system clock signal and divides its frequency by a dividing factor to form a divided external clock signal. The first delaying circuit of a plurality of serially connected delaying circuits is connected to the frequency divider circuit to receive the divided external clock signal, and each of the remaining delaying circuits delays the delayed external clock signal by an incremental period of delay to form a plurality of delayed and divided external clock signals. The first clock synchronization delay circuit of a plurality of clock synchronization delay circuits is connected to the frequency divider circuit and each remaining clock synchronization delay circuit is connected to one of the plurality of serially connected delaying circuits to synchronize each delayed and divided external clock signal to the external system clock signal. A logical combining circuit combines the synchronized, delayed and divided external clock signals to form the internal clock signal.

As in the first embodiment of the clock synchronizer circuit, the incremental period of delay is equal to a period of one cycle of the external system clock signal, and the number serially connected delaying circuit is one less than the dividing factor.

Each clock synchronization delay circuit is a synchronous mirror delay circuit. Each synchronous mirror delay circuit has a buffer circuit connected to one of the frequency divider circuit to buffer, amplify and delay one of the delayed and divided external timing signals to create a first timing signal. A fixed delay circuit is connected to the buffer circuit to delay the first timing signal by a circuit delay factor that is a sum of a first delay factor and a second delay factor. The first delay factor is a delay time of the frequency divider circuit and the buffer circuit. A forward delay circuit measures a difference time period that is the circuit delay factor subtracted from the period of the delayed and divided external timing signal. The mirror delay circuit is connected to the forward delay circuit and the buffer circuit to delay the first timing signal by the difference time period to create each synchronized, delayed and divided external clock signal. An internal buffer circuit is connected to the logical combining means to amplify and delay the internal clock signal. The delay time of the internal buffer circuit and the logical combining means is the second delay factor.

The clock synchronizer circuit applies particularly to such integrated circuits as a synchronous dynamic random access memory (SDRAM). The internal clock controls the transfer of digital data to and from the SDRAM When the dividing factor is set to two in a particular embodiment, the internal clock signal to be synchronized with the external system clock signal after four periods of the external system clock. Thus, the internal clock will in a general case synchronize within the number of cycles of the external system clock that is twice the dividing factor.

BRIEF DESCRIPTION OF THE DRAWINGS

FIG. 1a is a schematic diagram of a clock distribution circuit of the prior art.

FIG. 1b is timing diagram showing the effects of the clock skew of the clock distribution circuit of the prior art.

FIG. 2a is a schematic diagram of a clock synchronous delay circuit of the prior art.

FIG. 2b is a timing diagram of a clock synchronous delay circuit of the prior art.

DETAILED DESCRIPTION OF THE INVENTION

Figure 3:
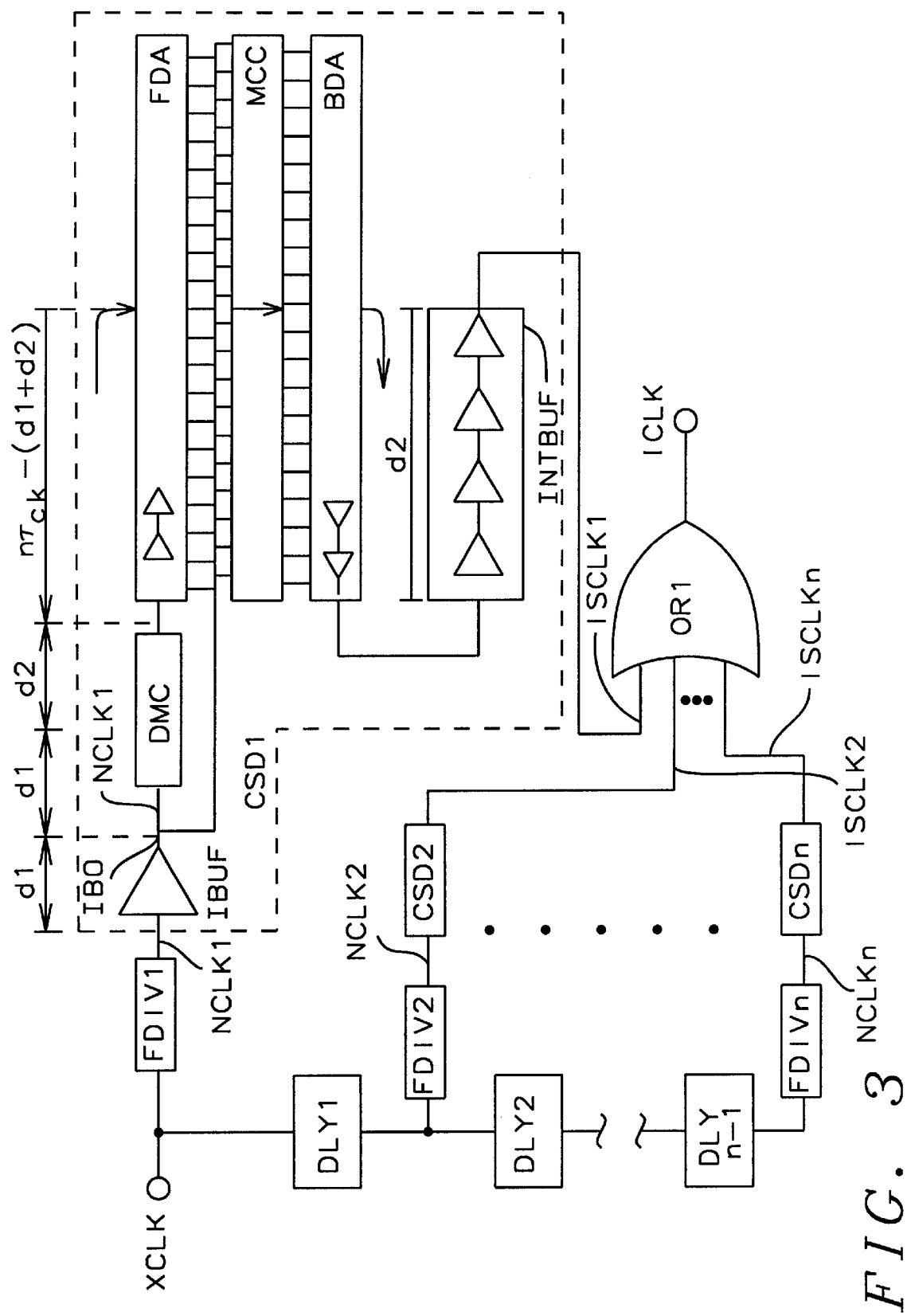
FIG. 3 is schematic diagram of a first embodiment of a clock synchronizer circuit of this invention.

Refer now to FIG. 3 for a description of the clock synchronization circuit of this invention. The external system clock signal is the input to a frequency divider FDIV1. The frequency divider FDIV1 divides the frequency or multiplies the period $\tau_{ck}$ by a dividing factor n to create the submultiple clock NCLK1. In the preferred embodiment of the invention, the dividing factor n is two. The submultiple clock NCLK1 is the input to the clock synchronous delay circuit CSD1. The submultiple clock NCLK1 of the clock synchronous delay circuit CSD1 is buffered, amplified, and delayed in the input buffer IBUF to create the output IBO. The output IBO of the input buffer IBUF is delayed by the delay factor $d_1$ from the external system clock signal. The output IBO of the input buffer IBUF is the input to the delay monitor circuit DMC. The delay monitor circuit DMC provides an output that is a delayed input signal IBO by a fixed amount that is usually the sum of the delay factor $d_1$ of the input buffer IBUF and the delay factor $d_2$ of the internal buffer INTBUF.

$$\tau_{FDA}=\tau_{ck}-(d_1+d_2)$$

where
$\tau_{ck}$ is the time of the period of the external clock XCLK.
$\tau_{FDA}$ is the time of the period of the external clock XCLK less the skew $d_1+d_2$.

The delayed clock pulse is further delayed by the factor $\tau_{FDA}$ in the backward delay array BDA. Thus the mth pulse output of the backward delay array BDA is delayed by a factor of $$2d_1+d_2+2(\tau_{ck}-(d_1+d_2))$$

This makes the mth pulse of the backward delay array BDA misaligned with the n+4 pulse of the external system clock XCLK by a factor of the delay $d_2$ of the internal buffer INTBUF.

The output of the backward delay array BDA is the input of the internal buffer INTBUF. The nth internal submultiple clock ISCLK1 is now be aligned with the system clock XCLK.

The output of the delay monitor circuit DMC is the input of the forward delay array FDA. The forward delay array FDA comprises a number of delay elements that each delay the input of the forward delay array FDA by an increment of time $\tau_{df}$. The output of each delay element of the forward delay array FDA is the input for each subsequent delay element and is also one of the multiple outputs of the forward delay array FDA.

The multiple outputs of the forward delay array FDA are inputs to the mirror control circuit MCC. The output IBO of the input buffer circuit IBUF is also provided to multiple inputs of the mirror control circuit MCC. The output IBO of the input buffer circuit IBUF is compared with each output of the forward delay array FDA. When one of the outputs of the forward delay array FDA is aligned with the n+1 pulse of the output IBO of the input buffer IBUF, the mirror control circuit transfers that one output to the backward delay array BDA. The mirror control circuit MCC has multiple outputs to transfer any one of the inputs of the mirror control circuit MCC from the forward delay array FDA to the backward delay array BDA. The backward delay array BDA is comprised of multiple delay elements. Each delay element has a delay time $\tau_{df}$ equal to the delay time of the forward delay array FDA.

The delayed clock pulse is delayed by a factor of:

The system clock XCLK is also an input to the first delay circuit DLY1 of a plurality of serially connected delaying circuits DLY1, DLY2, . . . , DLYn. The system clock XCLK is delayed by an incremental delay period that is equal to the period $\tau_{ck}$ The output of each of the serially connected delaying circuits DLY1, DLY2, . . . , DLYn is the input of one of the frequency dividers FDIV2, . . . , FDIVn−1. Each frequency divider FDIV2, . . . , FDIVn−1 divides the frequency of the delayed system clock to create the submultiple clocks NCLK2, . . . , NCLKn. Each of the submultiple clocks NCLK2, . . . , NCLKn are the inputs to the clock synchronous delay circuits CSD2, . . . , CSDn.

Each of the clock synchronous delay circuits CSD2, . . . , CSDn is structured identically to the clock synchronous delay circuit CSD1. The output of each of the clock synchronous delay circuits CSD1, CSD2, . . . , CSDn is one of the plurality of internal submultiple clocks ISCLK1, ISCLK2, . . . , ISCLKn. The plurality of internal submultiple clocks ISCLK1, ISCLK2, . . . , ISCLKn represent the time position of one of the pulses of the internal clock ICLK exactly aligned with the system clock XCLK with minimum misalignment and skewing.

The plurality of internal submultiple clocks ISCLK1, ISCLK2, . . . , ISCLKn are then logically combined (logically OR'ed) in the combining circuit to form the internal clock ICLK. The internal clock ICLK is then distributed to the internal circuits of the integrated circuit.

The clock synchronous delay circuits CSD1, CSD2, . . . , CSDn may be implemented as synchronous mirror delay circuits as described above and in T. Saeki, et al.

Figure 4:
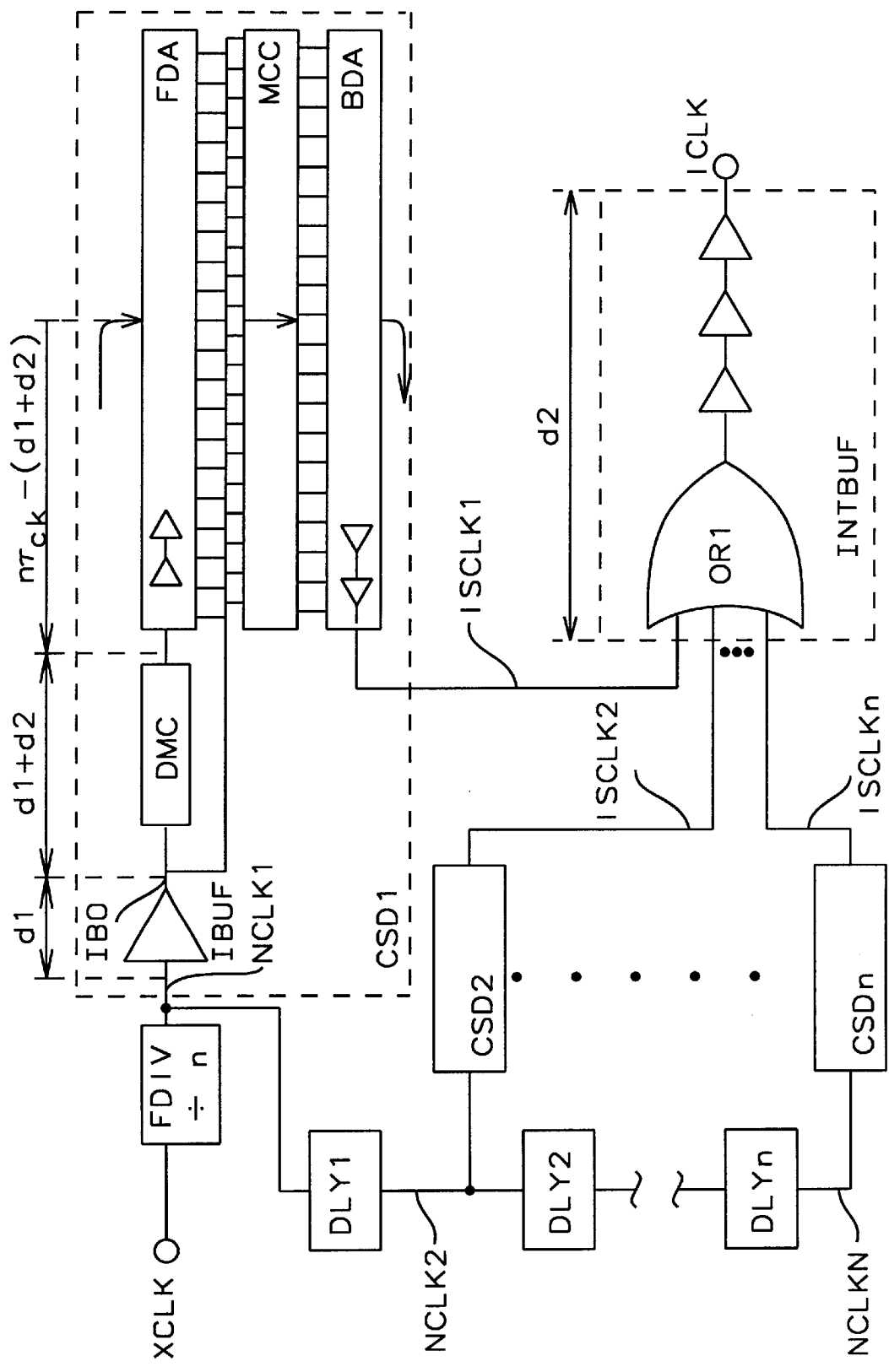
FIG. 4 is schematic diagram of a second embodiment of a clock synchronizer circuit of this invention.

A second embodiment of the clock synchronizer circuit of this invention is shown in FIG. 4. The system clock XCLK is the input to the frequency divider FDIV. The frequency divider FDIV divides the frequency of multiplies the period $\tau_{ck}$ by a dividing factor n to create a first submultiple clock NCLK1.

The first submultiple clock NCLK1 is the input to the clock synchronous delay circuit CSD1 and the first delaying circuit DLY1 of the plurality of delaying circuits DLY1, DLY2, . . . , DLYn−1. Each delaying circuit DLY1, DLY2, . . . , DLYn−1 delays the submultiple clock NCLK1 by an incremental delay period that is equal to the period $\tau_{ck}$ of the system clock XCLK to form the plurality of delay submultiple clocks NCLK1, NCLK2, . . . , NCLKn.

Each of the submultiple clocks NCLK1, NCLK2, . . . , NCLKn is buffered, amplified, and delayed in the input buffer IBUF to create the output IBO. The output IBO of the input buffer IBUF is delayed by the delay factor $d_1$ from the external system clock signal. The output IBO of the input buffer IBUF is the input to the delay monitor circuit DMC. The delay monitor circuit DMC provides an output that is a delayed input signal IBO by a fixed amount that is usually the sum of the delay factor $d_1$ of the input buffer IBUF and the delay factor $d_2$ of the internal buffer INTBUF.

The output of the delay monitor circuit DMC is the input of the forward delay array FDA. The forward delay array FDA comprises a number of delay elements that each delay the input of the forward delay array FDA by an increment of time τdf. The output of each delay element of the forward delay array FDA is the input for each subsequent delay element and is also one of the multiple outputs of the forward delay array FDA.

The multiple outputs of the forward delay array FDA are inputs to the mirror control circuit MCC. The output IBO of the input buffer circuit IBUF is also provided to multiple inputs of the mirror control circuit MCC. The output IBO of the input buffer circuit IBUF is compared with each output of the forward delay array FDA. When one of the outputs of the forward delay array FDA is aligned with the n+1 pulse of the output IBO of the input buffer IBUF, the mirror control circuit MCC transfers that one output to the backward delay array BDA. The mirror control circuit MCC has multiple outputs to transfer any one of the inputs of the mirror control circuit MCC from the forward delay array FDA to the backward delay array BDA. The backward delay array BDA is comprised of multiple delay elements. Each delay element has a delay time $\tau_{df}$ equal to the delay time of the forward delay array FDA.

The delayed clock pulse is delayed by a factor of:

$$\tau_{FDA}=\tau_{ck}-(d_1+d_2)$$

where
$\tau_{ck}$ is the time of the period of the external clock XCLK.
$\tau_{FDA}$ is the time of the period of the external clock XCLK less the skew $d_1+d_2$.

The delayed clock pulse is further delayed by the factor $\tau_{FDA}$ in the backward delay array BDA. Thus the mth pulse output of the backward delay array BDA is delayed by a factor of $$2d_1+d_2+2(\tau_{ck}-(d_1+d_2))$$

This makes the mth pulse of the backward delay array BDA of each of the clock synchronous delay circuits CSD1, CSD2, ..., CSDn is misaligned with the m+2n pulse of the external system clock XCLK by a factor of the delay $d_2$ of the internal buffer INTBUF.

The output of the backward delay array BDA is the input of the internal buffer INTBUF. The internal buffer INTBUF logically combines the outputs of each of the clock synchronous delay circuits CSD1, CSD2, ..., CSDn, buffers, and delays by the second factor of delay $d_2$ the combined outputs of the clock synchronous delay circuits CSD1, CSD2, ..., CSDn to form the internal that is now aligned with the system clock XCLK.

If the system clock XCLK is disabled by the clock enable CLKE of the SDRAM and then re-enabled and the dividing factor n is two, it requires four system clock cycles for the internal clock ICLK to align with the external system clock signal. Thus, any data can be accessed within two clock periods $\tau_{ck}$ of the external system clock signal XCLK once the internal clock ICLK is aligned with the external system clock signal XCLK.

As described above, the mirror control circuit MCC is of two types. The first type, as described in Yamada et al., is a latch that fixes the delay segment of the forward delay element FDA selected to be transferred to the backward delay array BDA. Once the latch is set it is only reset during the inactivity time of the SDRAM. Upon reactivation of the SDRAM, the decision of the length of the delay necessary is recreated.

The second type of mirror control circuit MCC, as described above, is the synchronous mirror delay. The mirror control circuit MCC is a pass gate that is activated when the output of the forward delay element FDA is aligned with the n+1 pulse of the output IBO of the input buffer circuit IBUF. The synchronous mirror delay chooses, on each cycle of the external system clock signal XCLK, which of the delay elements is satisfactory to align with the output IBO of the input buffer circuit IBUF.

Figure 5:
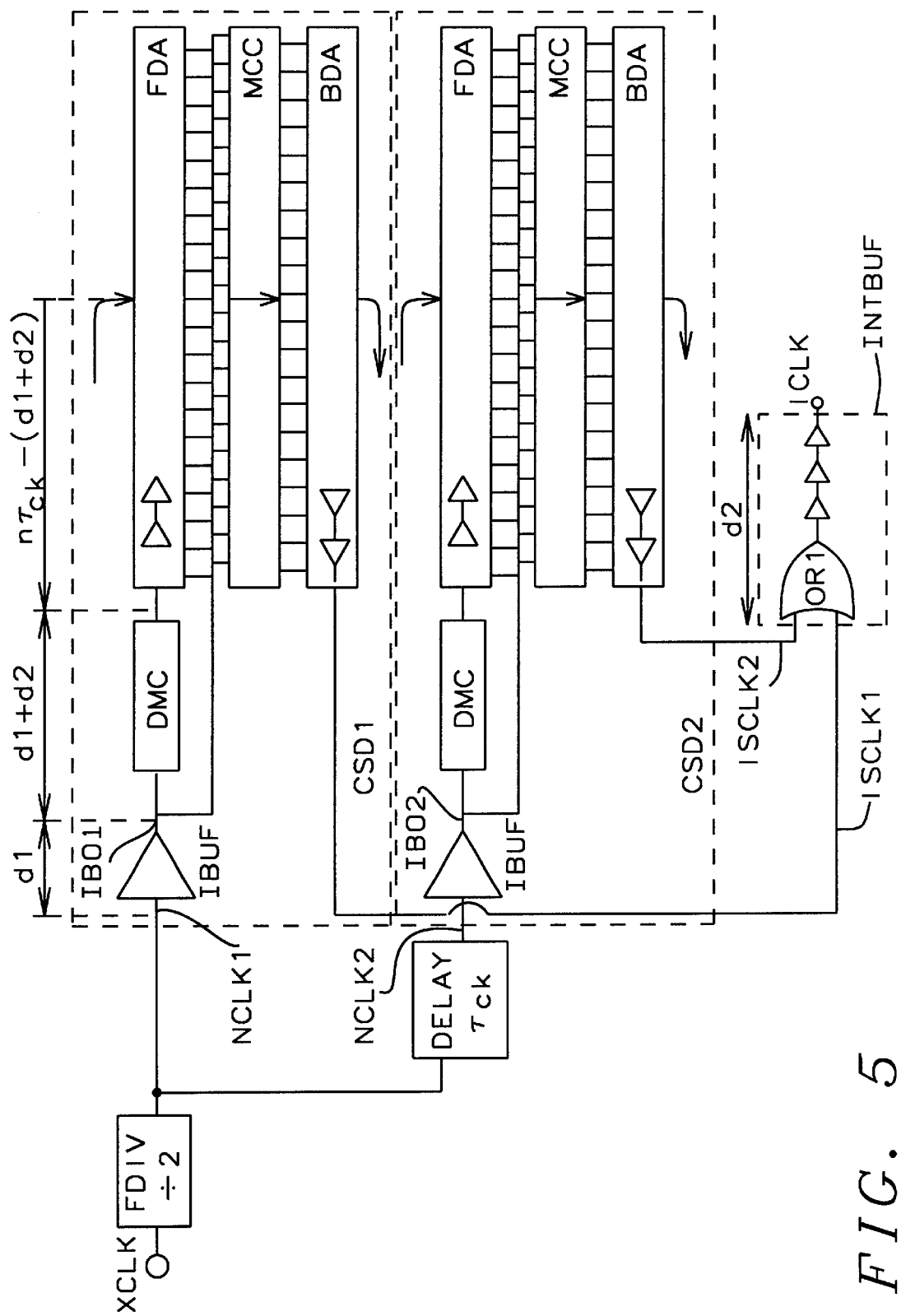
FIG. 5 is schematic diagram of an implementation of the second embodiment of a clock synchronizer circuit (FIG. 4) of this invention.

Refer now to FIG. 5 to discuss a representative implementation of the second embodiment of this invention. In this embodiment the dividing factor n is equal to two. The system clock XCLK is the input to the frequency divider FDIV. The frequency divider FDIV divides the frequency (multiplies the period $\tau_{ck}$) of the system clock XCLK by a factor of two to create the first submutiple clock NCLK1. The first submultiple clock NCLK1 is the input to the delay circuit. The delay circuit delays the first submultiple clock NCLK1 by a delay factor that is equal to the period $\tau_{ck}$ of the system clock XCLK to create the second submultiple clock NCLK2. The first and second multiple clocks NCLK1 and NCLK2 are the inputs to the clock synchronous delay circuits CSD1 and CSD2.

The submultiple clocks NCLK1, and NCLK2 are each buffered, amplified, and delayed in the input buffers IBUF the clock synchronous delay circuits CSD1 and CSD2 to create the output IBO1 and IBO2. The outputs IBO1 and IBO2 of the input buffers IBUF the clock synchronous delay circuits CSD1 and CSD2 are delayed by the delay factor $d_1$ respectively from the submultiple clocks NCLK1, and NCLK2. The outputs IBO1 and IBO2 of the input buffers IBUF the clock synchronous delay circuits CSD1 and CSD2 are the inputs to the delay monitor circuits DMC from the submultiple clocks NCLK1, and NCLK2. The delay monitor circuits DMC from the submultiple clocks NCLK1, and NCLK2 each provide an output that is the delayed input signal IBO1 and IBO2 by a fixed amount that is usually the sum of the delay factor $d_1$ of the input buffers IBUF the clock synchronous delay circuits CSD1 and CSD2 and the delay factor $d_2$ of the internal buffer INTBUF.

The output of each of the delay monitor circuits DMC of the clock synchronous delay circuits CSD1 and CSD2 area respectively the inputs of the forward delay arrays FDA the clock synchronous delay circuits CSD1 and CSD2. The forward delay arrays FDA the clock synchronous delay circuits CSD1 and CSD2 each comprise a number of delay elements that each delay the input of each of the forward delay arrays FDA the clock synchronous delay circuits CSD1 and CSD2 by an increment of time $\tau_{df}$. The output of each delay element of each of the forward delay arrays FDA the clock synchronous delay circuits CSD1 and CSD2 are the input for each subsequent delay element and is also one of the multiple outputs of each of the forward delay array FDA the clock synchronous delay circuits CSD1 and CSD2.

The multiple outputs of each of the forward delay array FDA the clock synchronous delay circuits CSD1 and CSD2 are inputs to each of the mirror control circuit MCC the clock synchronous delay circuits CSD1 and CSD2. Each of the outputs IBO1 and IBO2 of the input buffer circuits IBUF the clock synchronous delay circuits CSD1 and CSD2 are also provided to multiple inputs of each of the mirror control circuits MCC the clock synchronous delay circuits CSD1 and CSD2. Each of the outputs IBO1 and IBO2 of the input buffer circuit IBUF the clock synchronous delay circuits CSD1 and CSD2 are compared with each output of each of the forward delay arrays FDA the clock synchronous delay circuits CSD1 and CSD2. When one of the outputs of each of the forward delay arrays FDA the clock synchronous delay circuits CSD1 and CSD2 are aligned with the n+1 pulse of each of the outputs IBO1 and IBO2 of the input buffer IBUF the clock synchronous delay circuits CSD1 and CSD2, each of the mirror control circuits MCC the clock synchronous delay circuits CSD1 and CSD2 transfers that one output to the backward delay array BDA of each of the clock synchronous delay circuits CSD1 and CSD2. Each of the mirror control circuits MCC the clock synchronous delay circuits CSD1 and CSD2 has multiple outputs to transfer any one of the inputs of the mirror control circuit MCC respectively from the forward delay array FDA of each of the clock synchronous delay circuits CSD1 and CSD2 to the backward delay array BDA of each of the lock synchronous delay circuits CSD1 and CSD2. Each of the backward delay arrays BDA of the clock synchronous delay circuits CSD1 and CSD2 are comprised of multiple delay elements. Each delay element has a delay time $\tau_{df}$ equal to the delay time of each of the forward delay arrays FDA the clock synchronous delay circuits CSD1 and CSD2.

The delayed clock pulse is delayed by a factor of:

$$\tau_{FDA}=\tau_{ck}-(d_1+d_2)$$

where $\tau_{ck}$ is the time of the period of the external clock.

$\tau_{FDA}$ is the time of the period of the external clock less the skew $d_1+d_2$.

The delayed clock pulse is further delayed by the factor $\tau_{FDA}$ in the backward delay array BDA of the clock synchronous delay circuits CSD1 and CSD2. Thus the mth pulse output of each of the backward delay arrays BDA the clock synchronous delay circuits CSD1 and CSD2 is delayed by a factor of $$2d_1+d_2+2(\tau_{ck}-(d_1+d_2))$$

This makes the mth pulse of each of the backward delay arrays BDA the clock synchronous delay circuits CSD1 and CSD2 misaligned with the n+4 pulse of the external system clock XCLK by a factor of the delay $d_2$ of the internal buffer INTBUF.

The outputs of the backward delay arrays BDA the clock synchronous delay circuits CSD1 and CSD2 are the inputs of the internal buffer INTBUF. The internal buffer INTBUF logically combines the outputs of each of the clock synchronous delay circuits CSD1, and CSD2 buffers, and delays by the second factor of delay $d_2$ the combined outputs of the clock synchronous delay circuits CSD1, CSD2, . . . , CSDn to form the internal clock ICLK that is now aligned with the system clock XCLK. The internal clock ICLK is then transferred to the internal circuits of the integrated circuit to the timing of the integrated circuit. In the case of an SDRAM the internal clock ICLK controls the transfer of data to and from the SDRAM and within the SDRAM.

Figure 6:
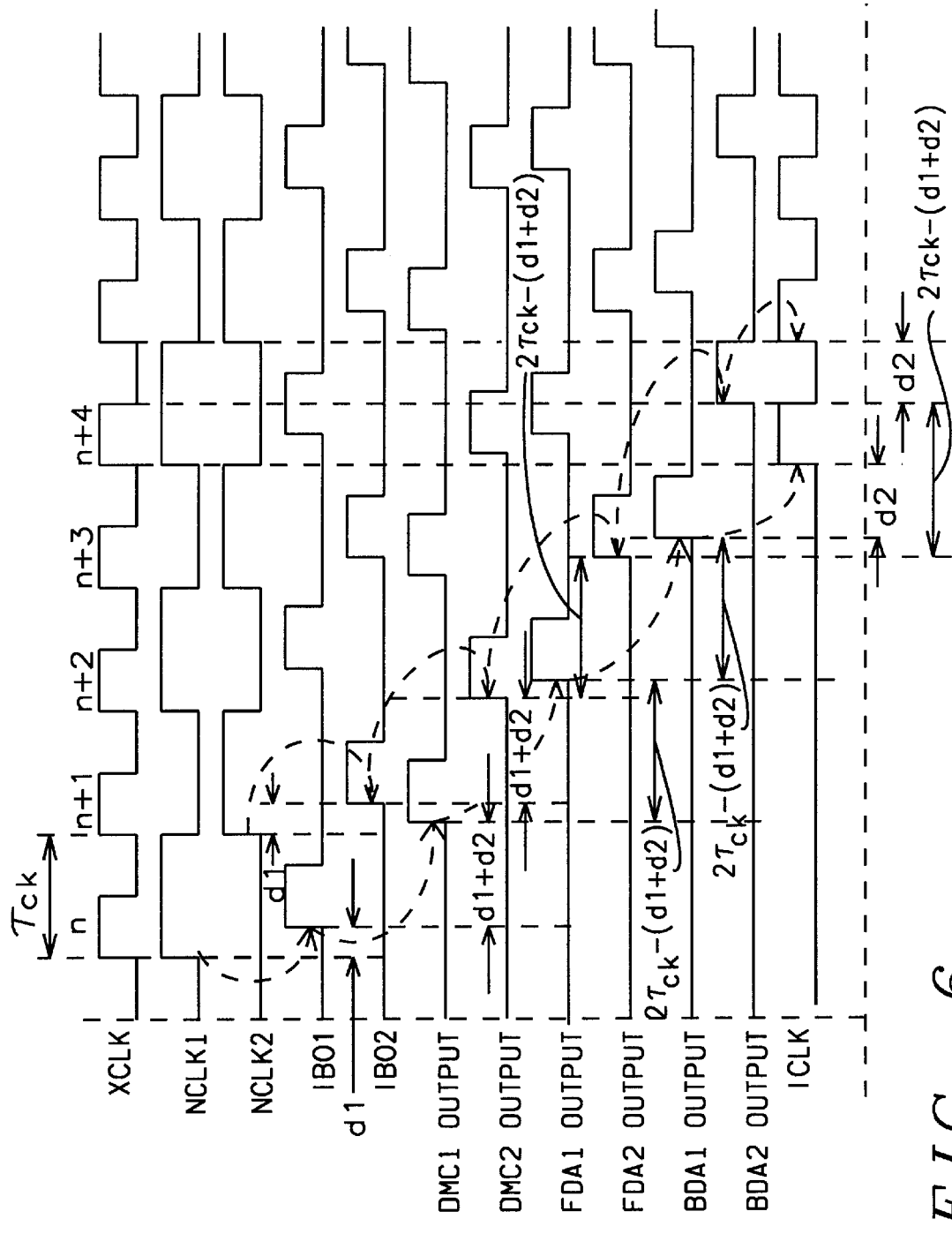
FIG. 6 is a timing diagram of the process to perform a synchronization of an internal clock signal with an external clock signal of this invention, as implemented in the circuit of FIG. 5.

Refer now to FIG. 6 to review the method of generation of an internal clock ICLK from an external system clock signal XCLK. The frequency of the external system clock signal XCLK is divided by the dividing factor n to create a first timing signal NCLK1 that has a period that is the period $\tau_{ck}$ of the external system clock signal XCLK multiplied by the dividing factor n. The first timing signal NCLK1 is buffered and delayed by the first delay factor $d_1$ to generate the first buffered timing signal IBO1. The first buffered timing signal IBO1 is then further delayed by a second delay factor $(d_1+d_2)$ to generate the first fixed delay signal DMC1. The second delay factor $(d_1+d_2)$ is the sum of the first delay factor $d_1$ and a third delay factor $d_2$. The third delay factor is the physical delay of the internal buffer INTBUF of FIG. 5. The fixed delay signal then provides a measurement of the difference between the period of the external system clock signal XCLK multiplied by the dividing factor n and the second delay factor $(d_1+d_2)$. That is $$\tau_{FDA} = 2\tau_{ck} - (d_1+d_2)$$

where $2\tau_{ck}$ is the factor n multiplied by the time of the period $\tau_{ck}$ of the external clock XCLK.

$\tau_{FDA}$ is the time of the period of the external clock less the skew $d_1+d_2$.

The first buffered timing signal IBO1 is then delayed by the time of the difference measurement $\tau_{fda}$ to generate a first backward delay signal BDA1. The first backward delay signal BDA1 is then delayed by the third delay factor $d_2$ to generate a first set of alternating pulses (or odd numbered pulses) of the internal clock ICLK.

The first timing signal NCLK1 is delayed by an incremental delay period to form a second timing signal NCLK2. The incremental delay period is the period $\tau_{ck}$ of the external system The second timing signal NCLK2 is buffered and delayed by the second delay factor $d_1$ to generate the second buffered timing signal IBO2. The second buffered timing signal IBO2 is then further delayed by a second delay factor $(d_1+d_2)$ to generate the second fixed delay signal DMC2. The second delay factor $(d_1+d_2)$ is the sum of the second delay factor $d_1$ and a third delay factor $d_2$. The third delay factor is the physical delay of the internal buffer INTBUF of FIG. 5. The fixed delay signal then provides a measurement of the difference between the period of the external system clock signal XCLK multiplied by the dividing factor n and the second delay factor $(d_1+d_2)$. That is $$\tau_{FDA} = 2\tau_{ck} - (d_1+d_2)$$

where $2\tau_{ck}$ is the factor n multiplied by the time of the period $\tau_{ck}$ of the external clock XCLK.

$\tau_{FDA}$ is the time of the period of the external clock less the skew $d_1+d_2$.

The second buffered timing signal IBO2 is then delayed by the time of the difference measurement $\tau_{fda}$ to generate a second backward delay signal BDA2. The second backward delay signal BDA2 is then delayed by the third delay factor $d_2$ to generate a second set of alternating pulses (or even numbered pulses) of the internal clock ICLK. The first and second set of alternating pulses (the even and odd number pulses) are logically combines (OR'ed) to form the internal clock ICLK. The internal clock ICLK is then transferred to the circuits of the integrated circuit. If the integrated circuit is an SDRAM, the internal clock ICLK is then aligned with the external system clock signal XCLK to facilitate transfer of data to and from the banks of arrays of memory cells of the SDRAM.

As is apparent from FIG. 6, if the value of the dividing factor n is two, the internal clock ICLK becomes synchronized with the external system clock XCLK in four cycles from the activation of the external system clock XCLK. Thus, a dividing factor n in the general case causes the internal clock ICLK to become synchronized with the external system clock XCLK within two times the dividing factor n cycles of the starting of the external system clock XCLK.

While this invention has been particularly shown and described with reference to the preferred embodiments thereof, it will be understood by those skilled in the art that various changes in form and details may be made without departing from the spirit and scope of the invention.

The invention claimed is:

1. A clock synchronizer circuit to provide an internal clock signal for an integrated circuit that is synchronized to an external system clock signal, such that said internal clock signal is aligned with and has minimal skew from said external system clock signal, whereby said clock synchronizer circuit is comprising:

a plurality of serially connected delaying means to receive said external system clock signal and delay said external system clock signal by an incremental period of delay;

a plurality of frequency divider means, whereby a first frequency divider means receives said external system clock signal and divides a frequency of said external system clock signal by a dividing factor and each remaining frequency divider means is connected to an output of one of the serially connected delaying means to divide a delayed external system clock signal by said dividing factor providing a plurality of divided external system clock signals;

a plurality of clock synchronization delay means, whereby each clock synchronization delay means is connected to one of the plurality of frequency divider means to synchronized each divided external system clock signal to the external system clock signal; and a logical combining means to combine the synchronize, divided external system clock signals to form said internal clock signal.

2. The clock synchronizer circuit of claim 1 wherein said incremental period of delay is equal to a period of one cycle of said external system clock signal.

3. The clock synchronizer circuit of claim 1 wherein the number serially connected delaying means is one less than said dividing factor.

4. The clock synchronizer circuit of claim 1 wherein the number of frequency divider means is equal to the dividing factor.

5. The clock synchronizer circuit of claim 1 wherein each clock synchronization delay means is a synchronous mirror delay circuit.

6. The clock synchronizer circuit of claim 5 wherein the synchronous mirror delay circuit is comprising:
- a buffer circuit connected to one of the frequency divider means to buffer, amplify and delay one of the delayed and divided external timing signals to create a first timing signal;
- a fixed delay circuit connected to the buffer circuit to delay the first timing signal by a circuit delay factor that is a sum of a first delay factor and a second delay factor, whereby said first delay factor is a delay time of the frequency divider means and the buffer circuit;
- a forward delay circuit to measure a difference time period that is the circuit delay factor subtracted from the period of the delayed and divided external timing signal;
- a mirror delay circuit connected to the forward delay circuit and the buffer circuit to delay the first timing signal by the difference time period to create a second timing signal; and
- an internal buffer circuit connected to the mirror delay circuit to amplify, delay the second timing signal to create the synchronized, divided external system clock signal whereby a delay time of said internal buffer circuit is the second delay factor.

7. The clock synchronizer circuit of claim 1 wherein said integrated circuit is a synchronous dynamic random access memory and said internal clock controls a transfer of digital data to and from said synchronous dynamic random access memory.

8. The clock synchronizer circuit of claim 1 wherein the dividing factor is two.

9. The clock synchronizer circuit of claim 8 wherein the internal clock signal is synchronized with the external system clock signal after four periods of said external system clock signal.

10. A clock synchronizer circuit to provide an internal clock signal for an integrated circuit that is synchronized to an external system clock signal, such that said internal clock signal is aligned with and has minimal skew from said external system clock signal, whereby said clock synchronizer circuit is comprising:
- a frequency divider means that receives said external system clock signal and divides its frequency by a dividing factor to form a divided external clock signal;
- a plurality of serially connected delaying means, whereby a first delaying means is connected to the frequency divider means to receive the divided external clock signal, and each delaying means delays said delayed external clock signal by an incremental period of delay to form a plurality of delayed and divided external clock signals;
- a plurality of clock synchronization delay means, whereby a first clock synchronization delay means is connected to frequency divider means and each remaining clock synchronization delay means is connected to one of the plurality of serially connected delaying means to synchronize each delayed and divided external clock signal to the external system clock signal; and
- a logical combining means to combine the synchronized, delayed and divided external clock signals to form said internal clock signal.

11. The clock synchronizer circuit of claim 10 wherein said incremental period of delay is equal to a period of one cycle of said external system clock signal.

12. The clock synchronizer circuit of claim 10 wherein the number serially connected delaying means is one less than said dividing factor.

13. The clock synchronizer circuit of claim 10 wherein each clock synchronization delay means is a synchronous mirror delay circuit.

14. The clock synchronizer circuit of claim 13 wherein the synchronous mirror delay circuit is comprising:
- a buffer circuit connected to one of the frequency divider means to buffer, amplify and delay one of the delayed and divided external timing signals to create a first timing signal;
- a fixed delay circuit connected to the buffer circuit to delay the first timing signal by a circuit delay factor that is a sum of a first delay factor and a second delay factor, whereby said first delay factor is a delay time of the frequency divider means and the buffer circuit;
- a forward delay circuit to measure a difference time period that is the circuit delay factor subtracted from the period of the delayed and divided external timing signal;
- a mirror delay circuit connected to the forward delay circuit and the buffer circuit to delay the first timing signal by the difference time period to create each synchronized, delayed and divided external clock signal; and
- an internal buffer circuit connected to the logical combining means to amplify and delay the internal clock signal whereby a delay time of said internal buffer circuit and the logical combining means is the second delay factor.

15. The clock synchronizer circuit of claim 10 wherein said integrated circuit is a synchronous dynamic random access memory and said internal clock controls a transfer of digital data to and from said synchronous dynamic random access memory.

16. The clock synchronizer circuit of claim 10 wherein the dividing factor is two.

17. The clock synchronizer circuit of claim 16 wherein the internal clock signal is synchronized with the external system clock signal after four periods of said external system clock signal.

18. A synchronous dynamic random access memory to retain digital data, comprising:
- a clock generator circuit connected between an external system clock distribution circuit and a plurality of banks of arrays of memory cells, an address circuit, a command circuit, a data control circuit, and a data input/output buffer to provide an internal clock signal to synchronize operation of said synchronous dynamic random access memory, whereby certain operations must occur in time with minimal deviation from said an external system clock signal and whereby said clock generator includes at least one clock synchronizer circuit, comprising;
  - a plurality of serially connected delaying means to receive said external system clock signal and delay said external system clock signal by an incremental period of delay;
  - a plurality of frequency divider means, whereby a first frequency divider means receives said external system clock signal and divides a frequency of said external system clock signal by a dividing factor and each remaining frequency divider means is connected to an output of one of the serially connected delaying means to divide a delayed external system clock signal by said dividing factor providing a plurality of divided external system clock signals;
  - a plurality of clock synchronization delay means, whereby each clock synchronization delay means is connected to one of the plurality of frequency divider means to synchronized each divided external system clock signal to the external system clock signal; and a logical combining means to combine the synchronized, divided external system clock signal to form said internal clock signal.

19. The synchronous dynamic random access memory of claim 18 wherein said incremental period of delay is equal to a period of one cycle of said external system clock signal.

20. The synchronous dynamic random access memory of claim 18 wherein the number of serially connected delaying means is one less than said dividing factor.

21. The synchronous dynamic random access memory of claim 18 wherein the number of frequency divider means is equal to the dividing factor.

22. The synchronous dynamic random access memory of claim 18 wherein each clock synchronization delay means is a synchronous mirror delay circuit.

23. The synchronous dynamic random access memory of claim 22 wherein the synchronous mirror delay circuit is comprising:

a buffer circuit connected to one of the frequency divider means to buffer, amplify and delay one of the delayed and divided external timing signals to create a first timing signal;

a fixed delay circuit connected to the buffer circuit to delay the first timing signal by a circuit delay factor that is a sum of a first delay factor and a second delay factor, whereby said first delay factor is a delay time of the frequency divider means and the buffer circuit;

a forward delay circuit to measure a difference time period that is the circuit delay factor subtracted from the period of the delayed and divided external timing signal;

a mirror delay circuit connected to the forward delay circuit and the buffer circuit to delay the first timing signal by the difference time period to create a second timing signal; and an internal buffer circuit connected to the mirror delay circuit to amplify, delay the second timing signal to create the internal clock signal whereby a delay time of said internal buffer circuit is the second delay factor.

24. The synchronous dynamic random access memory of claim 18 wherein said internal clock signal controls a transfer of digital data to and from said synchronous dynamic random access memory.

25. The synchronous dynamic random access memory of claim 18 wherein the dividing factor is two.

26. The synchronous dynamic random access memory of claim 18 wherein the internal clock signal is synchronized with the external system clock signal after four periods of said external system clock signal.

27. A synchronous dynamic random access memory to retain digital data, comprising:

a clock generator circuit connected between an external system clock distribution circuit and a plurality of banks of arrays of memory cells, an address circuit, a command circuit, a data control circuit, and a data input/output buffer to provide an internal clock signal to synchronize operation of said synchronous dynamic random access memory, whereby certain operations must occur in time with minimal deviation from said an external system clock signal and whereby said clock generator includes at least one clock synchronizer circuit, comprising;

a frequency divider means that receives said external system clock signal and divides its frequency by a dividing factor to form a divided external clock signal;

a plurality of serially connected delaying means, whereby a first delaying means is connected to the frequency divider means to receive the divided external clock signal, and each delaying means delays said delayed external clock signal by an incremental period of delay to form a plurality of delayed and divided external clock signals.;

a plurality of clock synchronization delay means, whereby a first clock synchronization delay means is connected to frequency divider means and each remaining clock synchronization delay means is connected to one of the plurality of serially connected delaying means to synchronize each delayed and divided external clock signal to the external system clock signal; and a logical combining means to combine the synchronized, delayed and divided external clock signals to form said internal clock signal.

28. The synchronous dynamic random access memory of claim 27 wherein said incremental period of delay is equal to a period of one cycle of said external system clock signal.

29. The synchronous dynamic random access memory of claim 27 wherein the number serially connected delaying means is one less than said dividing factor.

30. The synchronous dynamic random access memory of claim 27 wherein each clock synchronization delay means is a synchronous mirror delay circuit.

31. The synchronous dynamic random access memory of claim 30 wherein the synchronous mirror delay circuit is comprising:

a buffer circuit connected to one of the frequency divider means to buffer, amplify and delay one of the delayed and divided external timing signals to create a first timing signal;

a fixed delay circuit connected to the buffer circuit to delay the first timing signal by a circuit delay factor that is a sum of a first delay factor and a second delay factor, whereby said first delay factor is a delay time of the frequency divider means and the buffer circuit;

a forward delay circuit to measure a difference time period that is the circuit delay factor subtracted from the period of the delayed and divided external timing signal;

a mirror delay circuit connected to the forward delay circuit and the buffer circuit to delay the first timing signal by the difference time period to create each synchronized, delayed and divided external clock signal; and an internal buffer circuit connected to the logical combining means to amplify and delay the internal clock signal whereby a delay time of said internal buffer circuit and the logical combining means is the second delay factor.

32. The synchronous dynamic random access memory of claim 27 said internal clock signal controls a transfer of digital data to and from said synchronous dynamic random access memory.

33. The synchronous dynamic random access memory of claim 27 wherein the dividing factor is two.

34. The synchronous dynamic random access memory of claim 33 wherein the internal clock signal is synchronized with the external system clock signal after four periods of said external system clock signal.

35. A method for generating an internal clock signal for an integrated circuit that is synchronized to an external system clock, such that said internal clock signal is aligned with and has minimal skew from said external system clock signal whereby said method is comprising the steps of:

acquiring said external system clock signal;

generating a plurality of delayed, submultiple clock signals;

synchronizing by delaying each of said plurality of delayed submultiple clock signals to the external system clock to form a plurality of synchronized submultiple clocks; and logically combining said plurality of synchronized submultiple clocks to form the internal clock.

36. The method of claim 35 wherein generating the plurality of delayed, submultiple clock signals; by the steps of:

dividing a frequency of the external system clock by a dividing factor, and delaying each of said divided system clock signals sequentially by an incremental amount.

37. The method of claim 35 wherein generating the plurality of delayed, submultiple clock signals; by the steps of:

delaying each of said external system clock signals sequentially by an incremental amount to form a plurality of delayed external system clock signals; and dividing a frequency of the plurality of delayed external system clock signals by a dividing factor.

38. The method of claim 37 wherein the incremental amount is equal to a period of the external system clock.

39. The method of claim 38 wherein the incremental amount is equal to a period of the external system clock.

40. The method of claim 35 wherein the number of delayed submultiple clock signals is equal to the dividing factor.

41. The method of claim 35 wherein synchronizing by delaying comprises the steps of:

generating a first timing signal by the steps of buffering, amplifying and delaying said delayed submultiple clock;

generating a second timing signal by the step of delaying the first timing signal by a fixed delay factor, whereby said fixed delay factor is a sum of a first delay factor and a second delay factor, wherein said first delay factor is a time required for generating said first timing signal and said second timing signal;

measuring a difference time between the period of the first timing signal and the fixed delay factor;

generating a third timing signal by the step of delaying the first timing signal by said difference time; and generating each synchronized submultiple clock by the steps of delaying the second timing signal by the second delay factor and amplifying said delayed second timing signal.

42. The method of claim 35 wherein said integrated circuit is a synchronous dynamic random access memory and said internal clock controls a transfer of digital data to and from said synchronous dynamic random access memory.

43. The method of claim 36 wherein the number of delayed, submultiple clocks is two.

44. The method of claim 37 wherein the delayed, submultiple clocks is two.

45. The method of claim 43 wherein the internal clock signal is synchronized with the external system clock signal after four periods of said external system clock.

46. The method of claim 44 wherein the internal clock signal is synchronized with the external system clock signal after four periods of said external system clock.

* * * * *